US011869700B2

(12) United States Patent
Yen et al.

(10) Patent No.: US 11,869,700 B2
(45) Date of Patent: Jan. 9, 2024

(54) INDUCTOR DEVICE

(71) Applicant: Realtek Semiconductor Corporation, Hsinchu (TW)

(72) Inventors: Hsiao-Tsung Yen, Hsinchu (TW); Jian-You Chen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 282 days.

(21) Appl. No.: 17/015,331

(22) Filed: Sep. 9, 2020

(65) Prior Publication Data

US 2021/0074466 A1  Mar. 11, 2021

Related U.S. Application Data

(60) Provisional application No. 62/904,750, filed on Sep. 24, 2019, provisional application No. 62/898,618, filed on Sep. 11, 2019.

(30) Foreign Application Priority Data

Aug. 12, 2020 (TW) ................................. 109127421

(51) Int. Cl.
*H01F 27/28* (2006.01)
*H01F 27/40* (2006.01)
*H01F 27/29* (2006.01)

(52) U.S. Cl.
CPC ......... *H01F 27/2804* (2013.01); *H01F 27/29* (2013.01); *H01F 27/40* (2013.01); *H01F 2027/2809* (2013.01)

(58) Field of Classification Search
CPC ......... H01F 27/2804; H01F 2027/2809; H01F 17/0013; H01F 17/0006; H01F 5/003;
(Continued)

(56) References Cited

U.S. PATENT DOCUMENTS

2007/0268007 A1  11/2007 Rai
2008/0284553 A1  11/2008 Lim et al.
(Continued)

FOREIGN PATENT DOCUMENTS

CN  102483984 A  5/2012
CN  104717833 A  6/2015
(Continued)

OTHER PUBLICATIONS

China Patent Office, "Office Action", No. 202010825074.4, dated Dec. 30, 2021.
(Continued)

*Primary Examiner* — Tszfung J Chan
(74) *Attorney, Agent, or Firm* — Locke Lord LLP; Tim Tingkang Xia, Esq.

(57) ABSTRACT

An inductor device includes first trace, second trace, third trace, fourth trace, first capacitor, and second capacitor. One terminal of each of the at least two sub-traces of first trace are coupled to each other at first node. One terminal of each of the at least two sub-traces of second trace are coupled to each other at second node. One terminal of third trace is coupled to second trace, and another terminal of third trace is coupled to first input/output terminal. One terminal of fourth trace is coupled to first trace, and another terminal of fourth trace is coupled to second input/output terminal. First capacitor is coupled to first node and second node. Second capacitor is coupled between first node and first input/output terminal, or coupled between first node and second input/output terminal, or coupled between first input/output terminal and second input/output terminal.

19 Claims, 7 Drawing Sheets

(58) Field of Classification Search
CPC ........ H01F 27/29; H01F 27/292; H01F 27/40; H03H 7/0115
USPC .......................... 336/200, 232; 333/175, 185
See application file for complete search history.

(56) References Cited

U.S. PATENT DOCUMENTS

| | | |
|---|---|---|
| 2009/0096413 A1 | 4/2009 | Partovi et al. |
| 2013/0265132 A1 | 10/2013 | Huang et al. |
| 2013/0267185 A1 | 10/2013 | Chen et al. |
| 2016/0268039 A1 | 9/2016 | Park et al. |
| 2016/0336914 A1* | 11/2016 | Wang ..................... H03H 5/12 |
| 2018/0254139 A1 | 9/2018 | Yazaki |
| 2018/0254313 A1 | 9/2018 | Huang et al. |
| 2018/0294089 A1 | 10/2018 | Leong et al. |
| 2020/0177151 A1 | 6/2020 | Pierce et al. |

FOREIGN PATENT DOCUMENTS

| | | | |
|---|---|---|---|
| CN | 110335737 | A | 10/2019 |
| CN | 112489922 | A | 3/2021 |
| TW | 200535878 | A | 11/2005 |
| TW | 201342402 | A | 10/2013 |

OTHER PUBLICATIONS

U.S. Appl. No. 16/817,718, filed Mar. 13, 2020.
U.S. Appl. No. 17/014,063, filed Sep. 8, 2020.

* cited by examiner

INDUCTOR DEVICE

RELATED APPLICATIONS

This application claims priority to and the benefit of U.S. Provisional Patent Application No. 62/898,618, filed on Sep. 11, 2019, U.S. Provisional Patent Application No. 62/904,750, filed on Sep. 24, 2019, and Taiwan Application Serial Number 109127421, filed on Aug. 12, 2020, the entire contents of which are incorporated herein by reference as if fully set forth below in its entirety and for all applicable purposes.

BACKGROUND

Field of Invention

The present disclosure relates to an electronic device. More particularly, the present disclosure relates to an inductor device.

Description of Related Art

Radio frequency (RF) devices generates second harmonic, third harmonic, etc. during operation. The harmonics cause negative effect to other circuits. For example, second harmonic of 2.4 GHz circuit is near 5 GHz, and 5 GHz signal causes negative effect to system on chip (SoC).

Conventional way to solve negative effect caused by harmonics is that a filter will be disposed outside of a circuit for inducing high frequency signals of adjacent elements, and the filter is designed to select frequencies which need to be filtered and frequencies which does not need to be filtered. However, the filter disposed outside of the circuit will affect function of the circuit and generate additional cost. For example, the additional cost is the cost to dispose the filter on printed circuit board (PCB).

SUMMARY

In order to resolve the above problems, one aspect of the present disclosure provides an inductor device. The inductor device includes a first trace, a second trace, a third trace, a fourth trace, a first capacitor, and a second capacitor. The first trace includes at least two sub-traces, and one terminal of each of the at least two sub-traces are coupled to each other at a first node. The second trace includes at least two sub-traces, and one terminal of each of the at least two sub-traces are coupled to each other at a second node. The first trace and the third trace are disposed at a first side. One terminal of the third trace is coupled to the second trace, and another terminal of the third trace is coupled to a first input/output terminal. The second trace and the fourth trace are disposed at a second side. One terminal of the fourth trace is coupled to the first trace, and another terminal of the fourth trace is coupled to a second input/output terminal. The first capacitor is coupled to the first node and the second node. The second capacitor is coupled between the first node and the first input/output terminal, or coupled between the first node and the second input/output terminal, or coupled between the first input/output terminal and the second input/output terminal.

Therefore, based on the technical content of the present disclosure, the capacitor of the inductor device brings a function to filter low frequency, such that low frequency signal induced at the inductor device cannot pass but high frequency signal can pass the capacitor directly. Low frequency signal is, for example, a signal that uses 2.4 GHz as main operating frequency. An induced signal caused by the main operating frequency can be cancelled by the folded inductor of the inductor device. Therefore, the folded inductor will not affect the characteristic of the operating frequency of the inductor, and the induced signals flow through the folded inductor will be cancelled because the induced signals flow in opposite directions. If an inductor which is located at the center of the inductor device has a high frequency signal, for example, a second harmonic (i.e., 5 GHz signal), the high frequency signal may pass the capacitor and form an inductive inductor which is a circle flows through the folded inductor and the capacitor. Therefore, a 5 GHz harmonic signal corresponding to 2.4 GHz signal is induced in the inductor device of the present disclosure. The 5 GHz signal can be used in the circuit. For example, the 5 GHz signal can be amplified and then the amplified 5 GHz signal is used to cancel the 5 GHz harmonic signal of the operating frequency. The amplifying circuit can be arranged by a designer who is familiar with circuit design. As a result, a negative effect to a 5 GHz circuit can be reduced.

In addition, since the filter is disposed inside the inductor device of the present disclosure, there is no need to dispose a filter outside of the inductor device, so as to prevent an outer filter from affecting the circuit or prevent additional costs. In addition, the capacitor of the inductor device of the present disclosure is used to block high frequency signal (e.g., second harmonic), and the disposition of multiple capacitors of the inductor device of the present disclosure is used to further induce and filter signals (e.g., fourth harmonic) with a frequency, which is larger than a frequency of the high frequency signal, by a short circuit manner, so as to prevent negative effect to the circuit caused by fourth harmonic.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

Figure 1:
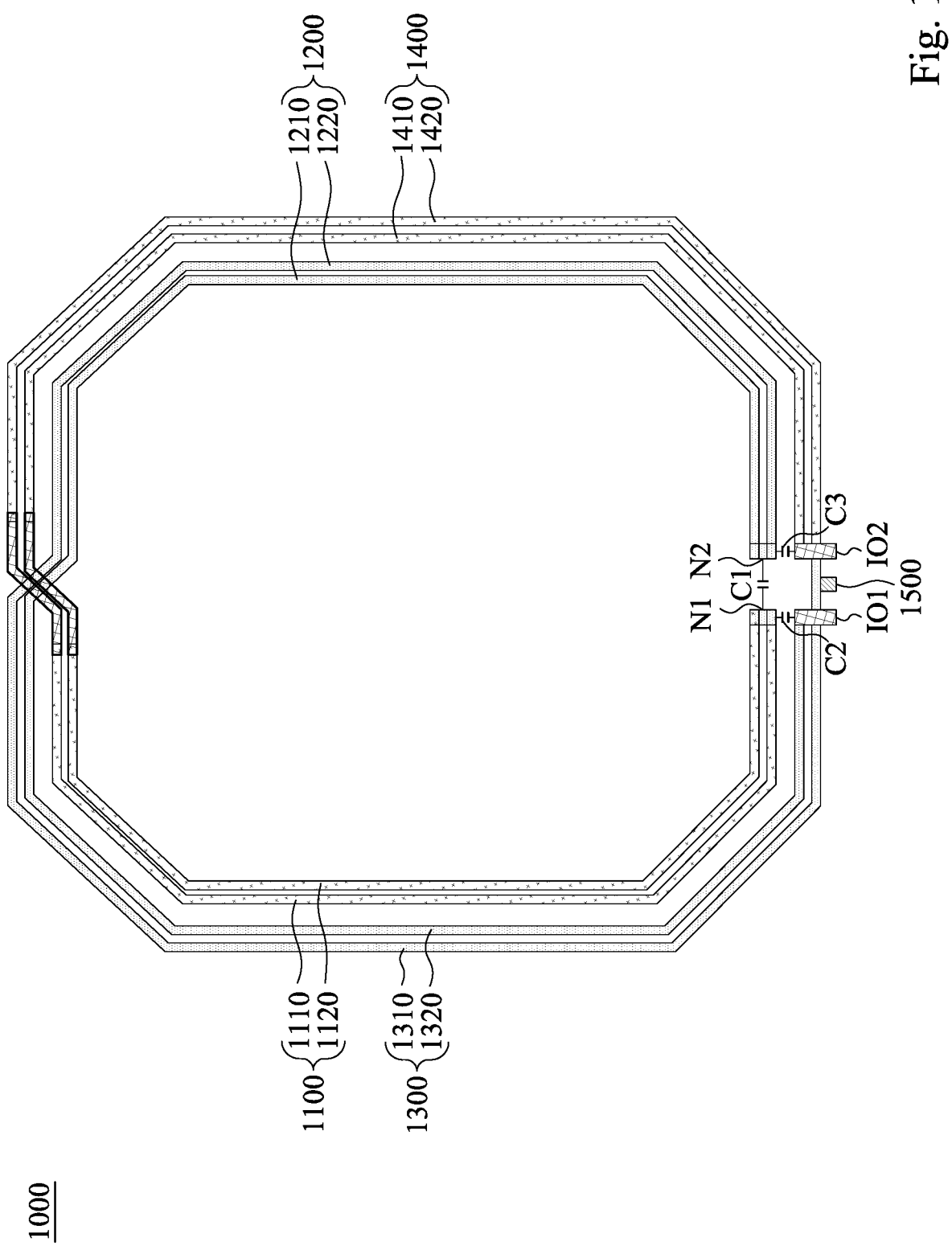
FIG. 1 depicts a schematic diagram of an inductor device according to one embodiment of the present disclosure.

FIG. 1 depicts a schematic diagram of an inductor device 1000 according to one embodiment of the present disclosure. For facilitating the understanding of the inductor device 1000 in FIG. 1, the structure of the inductor device 1000 in FIG. 1 is simplified to be a schematic diagram of the inductor device 1000 as illustrated in FIG. 2.

Figure 2:
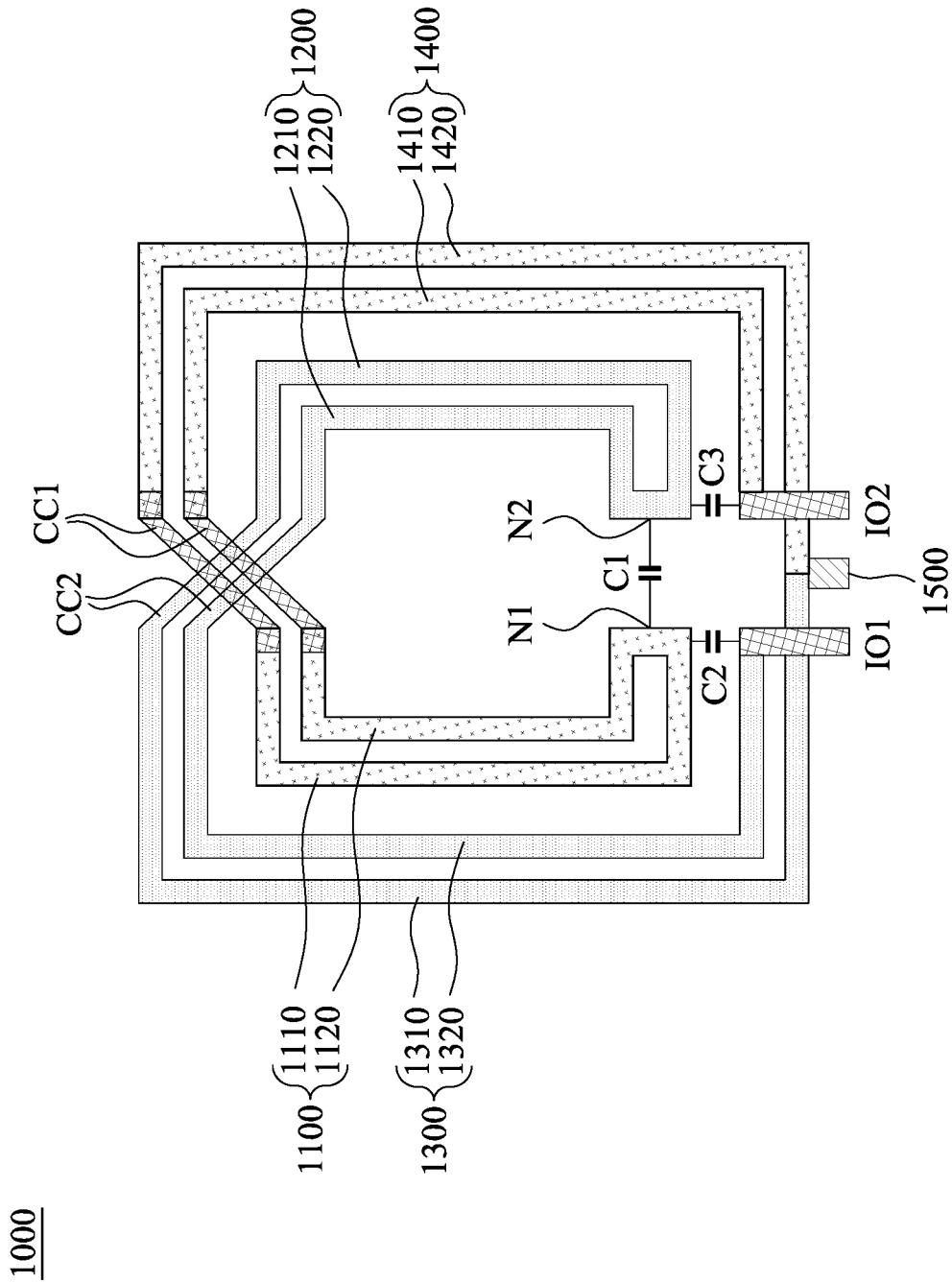
FIG. 2 depicts a schematic diagram of an inductor device according to one embodiment of the present disclosure.

Reference is now made to both FIG. 1 and FIG. 2. The inductor device 1000 includes a first trace 1100, a second trace 1200, a third trace 1300, a fourth trace 1400, a first capacitor C1, and a second capacitor C2. In addition, the first trace 1100 includes at least two sub-traces 1110, 1120. The second trace 1200 includes at least two sub-traces 1210, 1220.

In one embodiment, one terminal (e.g., the lower terminal) of each of the at least two sub-traces 1110, 1120 are coupled to each other at a first node N1. One terminal (e.g., the lower terminal) of each of the at least two sub-traces 1210, 1220 are coupled to each other at a second node N2. The first capacitor C1 is coupled between the first node N1 and the second node N2.

In addition, the first trace 1100 and the third trace 1300 are disposed at a first side of the inductor device 1000. For example, the first trace 1100 and the third trace 1300 are all disposed at the left side of the inductor device 1000, and the third trace 1300 is disposed at an outer side of the first trace 1100. One terminal of the third trace 1300 is coupled to one of the at least two sub-traces 1210, 1220 of the second trace 1200, and another terminal of the third trace 1300 is coupled to the first input/output terminal IO1.

In addition, the second trace 1200 and the fourth trace 1400 are disposed at a second side of the inductor device 1000. For example, the second trace 1200 and the fourth trace 1400 are all disposed at the right side of the inductor device 1000, and the fourth trace 1400 is disposed at an outer side of the second trace 1200. Besides, one terminal of the fourth trace 1400 is coupled to one of the at least two sub-traces 1110, 1120 of the first trace 1100, and another terminal of the fourth trace 1400 is coupled to the second input/output terminal IO2. In one embodiment, the first side and the second side are located at two opposite sides of the inductor device 1000.

Furthermore, the first capacitor C1 is coupled between the first node N1 and the second node N2. The second capacitor C2 is coupled between the first node N1 and the first input/output terminal IO1. In view of the above, when low frequency signal needs to be transmitted from the first node N1 to the second node N2, low frequency signal will be blocked by the first capacitor C1. For example, 2.4 GHz signal will be blocked by the first capacitor C1. Besides, when high frequency signal needs to be transmitted from the first node N1 to the second node N2, the high frequency signal can pass through the first capacitor C1. For example, 5 GHz signal can be transmitted from the first node N1 to the second node N2 through first capacitor C1. Moreover, if a signal with a frequency, which is larger than a frequency of the high frequency signal, needs to be transmitted from the first node N1 to the second node N2, a short circuit will be formed by the second capacitor C2, such that the signal with a frequency, which is larger than a frequency of the high frequency signal, will be induced to the first input/output terminal IO1 to be filtered. For example, 10 GHz signal will be induced and filtered by the second capacitor C2.

In one embodiment, each of the at least two sub-traces 1110, 1120 of the first trace 1100 includes U-typed sub-trace. For example, the sub-traces 1110, 1120 are all U-typed sub-traces. Besides, each of the at least two sub-traces 1210, 1220 of the second trace 1200 also includes U-typed sub-trace. For example, the sub-traces 1210, 1220 are all U-typed sub-traces. Besides, the third trace 1300 includes U-typed trace, and the fourth trace 1400 includes U-typed trace. However, the present disclosure is not intended to be limited in the embodiment of FIG. 2. In other embodiment, the shape of the trace and the sub-trace can be other suitable shape depending on actual requirements.

In another embodiment, as shown in FIG. 1 and FIG. 2, the first trace 1100 is coupled to the fourth trace 1400 at a third side (e.g. the upper side) through a first connection component CC1, and the second trace 1200 is coupled to the third trace 1300 at the third side (e.g. the upper side) through a second connection component CC2, and the first connection component CC1 and the second connection component CC2 are disposed in an interlaced manner at the third side (e.g. the upper side). In one embodiment, the first capacitor C1 and the second capacitor C2 are located at a fourth side (e.g., the lower side). Besides, the third side and the fourth side are located at two opposite sides of the inductor device 1000.

In one embodiment, referring to FIG. 1 and FIG. 2, the inductor device 1000 further includes a third capacitor C3. The third capacitor C3 is coupled between the second node N2 and the second input/output terminal IO2. In view of the above, when low frequency signal needs to be transmitted from the second node N2 to the first node N1, low frequency signal will be blocked by the first capacitor C1. When high frequency signal needs to be transmitted from the second node N2 to the first node N1, the high frequency signal can pass through the first capacitor C1. Furthermore, if a signal with a frequency, which is larger than a frequency of the high frequency signal, needs to be transmitted from the second node N2 to the first node N1, a short circuit will be formed by the third capacitor C3, such that the signal with a frequency, which is larger than a frequency of the high frequency signal, will be induced to the second input/output terminal IO2 to be filtered. For example, 10 GHz signal will be induced and filtered by the third capacitor C3.

Reference is now made to both FIG. 1 and FIG. 2. The first trace 1100 includes a first sub-trace 1110 and a second sub-trace 1120. Furthermore, the first sub-trace 1110 and the second sub-trace 1120 all include a first terminal and a second terminal. As shown in the figure, the second terminal (e.g., the lower terminal) of the first sub-trace 1110 is coupled to the second terminal (e.g., the lower terminal) of the second sub-trace 1120.

Besides, the second trace 1200 includes a third sub-trace 1210 and a fourth sub-trace 1220. In addition, the third sub-trace 1210 and the fourth sub-trace 1220 all include a first terminal and a second terminal. As shown in the figure, the second terminal (e.g., the lower terminal) of the third sub-trace 1210 is coupled to the second terminal (e.g., the lower terminal) of the fourth sub-trace 1220.

Reference is now made to both FIG. 1 and FIG. 2. The third trace 1300 includes a fifth sub-trace 1310 and a sixth sub-trace 1320. Furthermore, the fifth sub-trace 1310 and the sixth sub-trace 1320 all include a first terminal and a second terminal. As shown in the figure, the first terminal (e.g., the upper terminal) of the fifth sub-trace 1310 is coupled to the first terminal (e.g., the upper terminal) of the fourth sub-trace 1220. The first terminal (e.g., the upper terminal) of the sixth sub-trace 1320 is coupled to the first terminal (e.g., the upper terminal) of the third sub-trace 1210. Besides, the second terminal (e.g., the lower terminal) of the sixth sub-trace 1320 is coupled to the first input/output terminal IO1. Furthermore, the second terminal (e.g., the lower terminal) of the sixth sub-trace 1320 is coupled to the first node N1 through the second capacitor C2. In one embodiment, the first input/output terminal IO1 is not coupled to the fifth sub-trace 1310.

Reference is now made to both FIG. 1 and FIG. 2. The fourth trace 1400 includes a seventh sub-trace 1410 and an eighth sub-trace 1420. Furthermore, the seventh sub-trace 1410 and the eighth sub-trace 1420 all include a first terminal and a second terminal. As shown in the figure, the first terminal (e.g., the upper terminal) of the seventh sub-trace 1410 is coupled to the first terminal (e.g., the upper terminal) of the second sub-trace 1120, and the second terminal (e.g., the lower terminal) of the seventh sub-trace 1410 is coupled to the second input/output terminal IO2. Furthermore, the second terminal (e.g., the lower terminal) of the seventh sub-trace 1410 is coupled to the second node N2 through third capacitor C3. The first terminal (e.g., the upper terminal) of the eighth sub-trace 1420 is coupled to the first terminal (e.g., the upper terminal) of the first sub-trace 1110, and the second terminal (e.g., the lower terminal) of the eighth sub-trace 1420 is coupled to the second terminal (e.g., the lower terminal) of the fifth sub-trace 1310. In one embodiment, the second input/output terminal IO2 is not coupled to the eighth sub-trace 1420.

In another embodiment, the inductor device 1000 further includes a center-taped terminal 1500. The center-taped terminal 1500 is disposed at and coupled to a junction of the third trace 1300 and the fourth trace 1400. It is noted that, the present disclosure is not limited to the structure as shown in FIG. 2, and it is merely an example for illustrating one of the implements of the present disclosure.

Figure 3:
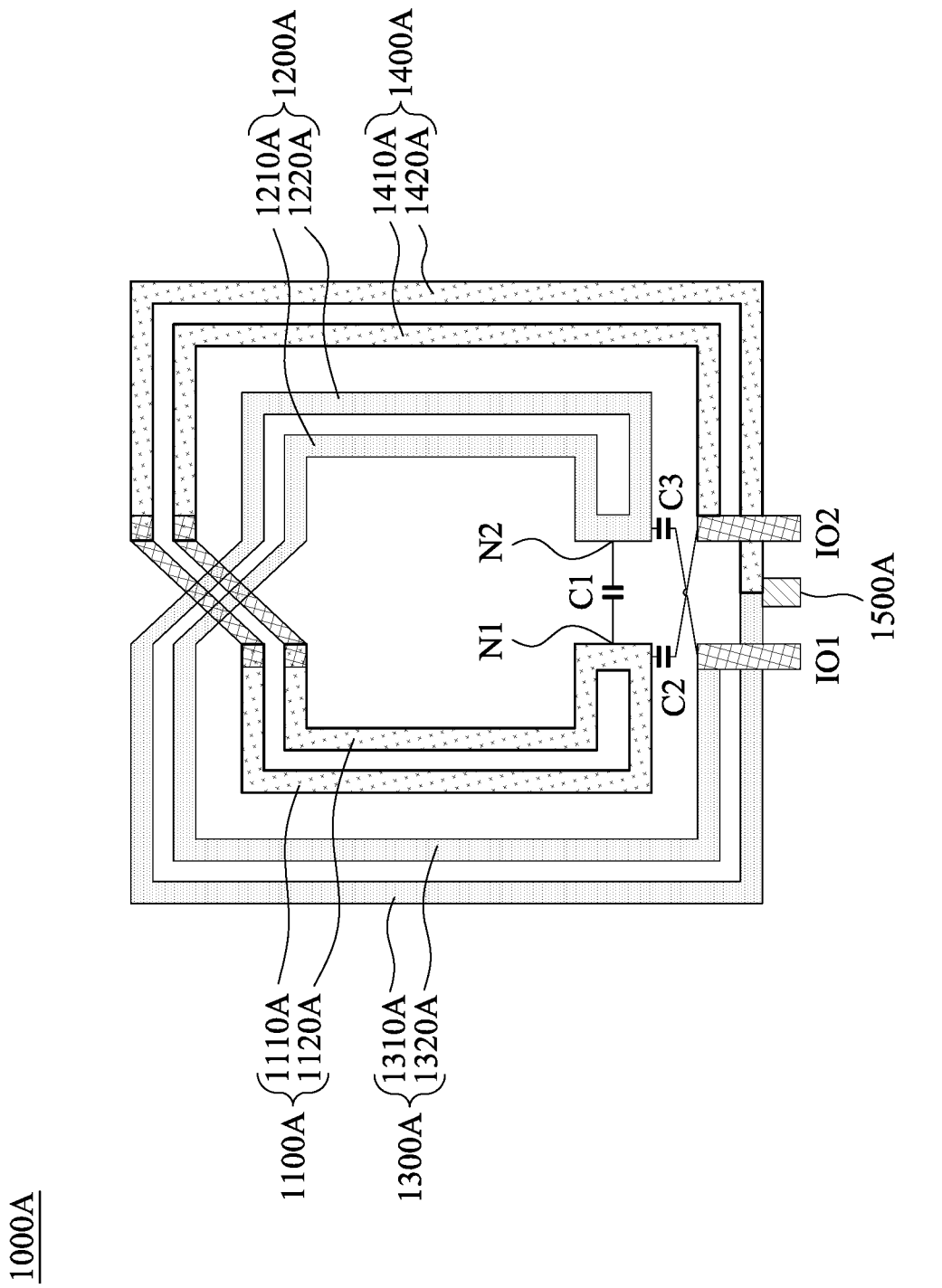
FIG. 3 depicts a schematic diagram of an inductor device according to one embodiment of the present disclosure.

FIG. 3 depicts a schematic diagram of an inductor device 1000A according to one embodiment of the present disclosure. Compared with the inductor device 1000 shown in FIG. 2, connections of the second capacitor C2 and the third capacitor C3 of the inductor device 1000A shown in FIG. 3 are different. As shown in FIG. 3, the second capacitor C2 is coupled between the first node N1 and the second input/output terminal IO2, and the third capacitor C3 is coupled between the second node N2 and the first input/output terminal IO1. It is noted that, the element in FIG. 3, whose symbol is similar to the symbol of the element in FIG. 2, has similar structure feature in connection with the element in FIG. 2. Therefore, a detail description regarding the structure feature of the element in FIG. 3 is omitted herein for the sake of brevity. Besides, the present disclosure is not limited to the structure as shown in FIG. 3, and it is merely an example for illustrating one of the implements of the present disclosure.

Figure 4:
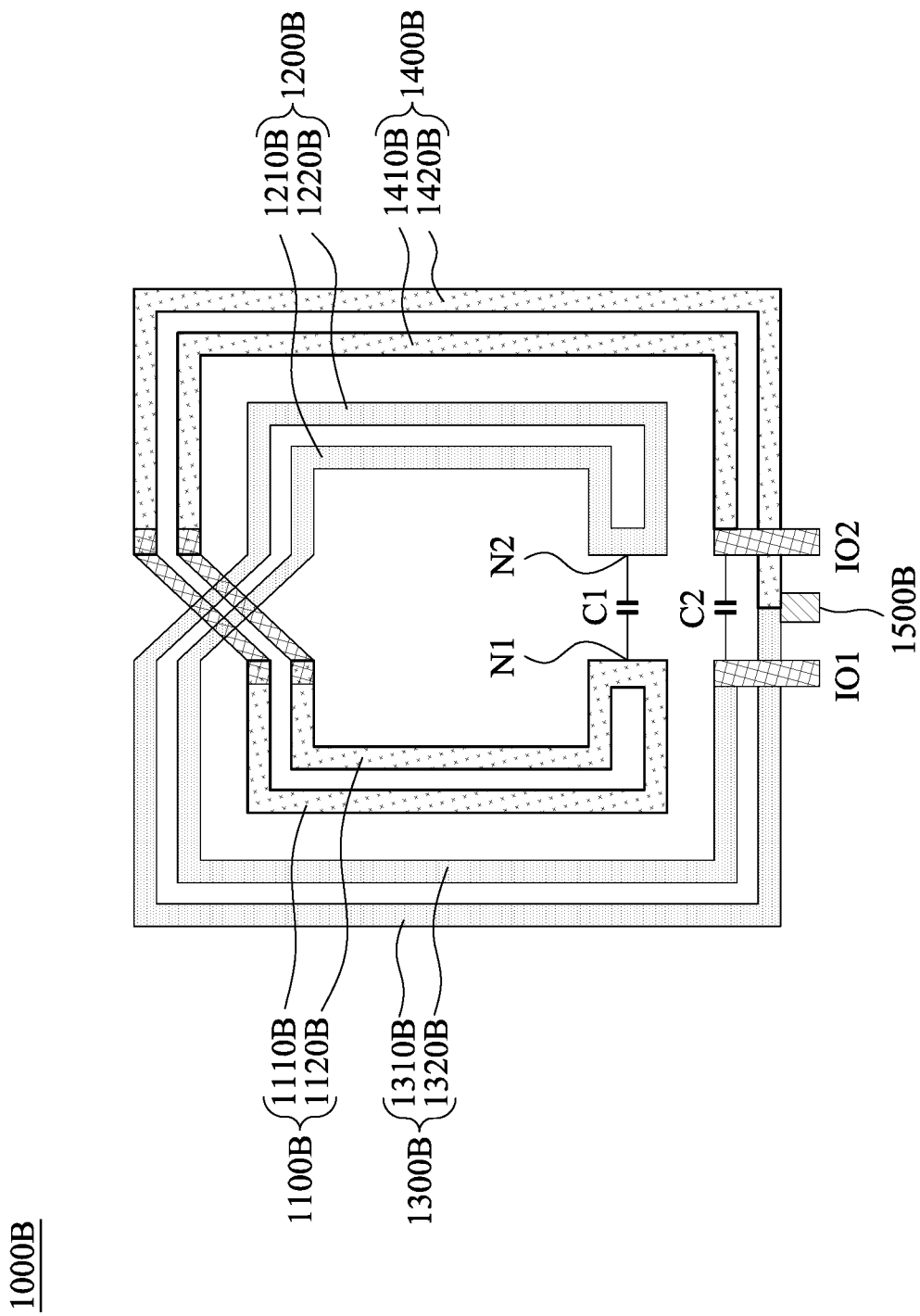
FIG. 4 depicts a schematic diagram of an inductor device according to one embodiment of the present disclosure.

FIG. 4 depicts a schematic diagram of an inductor device 1000B according to one embodiment of the present disclosure. Compared with the inductor device 1000 shown in FIG. 2, connections of the second capacitor C2 of the inductor device 1000B shown in FIG. 4 are different. As shown in FIG. 4, the second capacitor C2 is coupled between the first input/output terminal IO1 and the second input/output terminal IO2. It is noted that, the element in FIG. 4, whose symbol is similar to the symbol of the element in FIG. 2, has similar structure feature in connection with the element in FIG. 2. Therefore, a detail description regarding the structure feature of the element in FIG. 4 is omitted herein for the sake of brevity. Besides, the present disclosure is not limited to the structure as shown in FIG. 4, and it is merely an example for illustrating one of the implements of the present disclosure.

Figure 5:
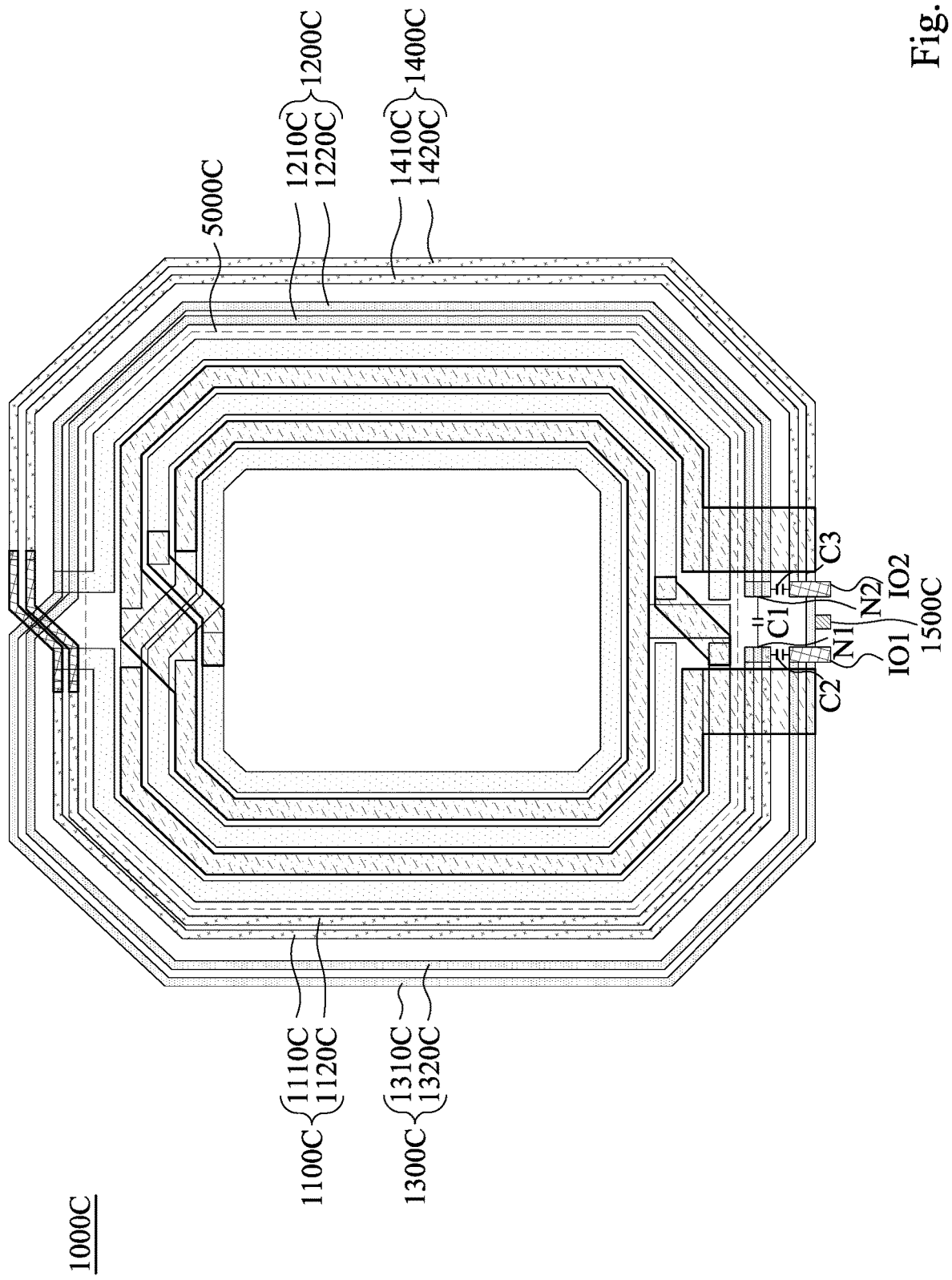
FIG. 5 depicts a schematic diagram of an inductor device according to one embodiment of the present disclosure.

FIG. 5 depicts a schematic diagram of an inductor device 1000C according to one embodiment of the present disclosure. Compared with the inductor device 1000 shown in FIG. 1, there is an inductor 5000C inside the inductor device 1000C of FIG. 5. It is noted that, the element in FIG. 5, whose symbol is similar to the symbol of the element in FIG. 1, has similar structure feature in connection with the element in FIG. 1. Therefore, a detail description regarding the structure feature of the element in FIG. 5 is omitted herein for the sake of brevity. Besides, the present disclosure is not limited to the structure as shown in FIG. 5, and it is merely an example for illustrating one of the implements of the present disclosure.

Figure 6:
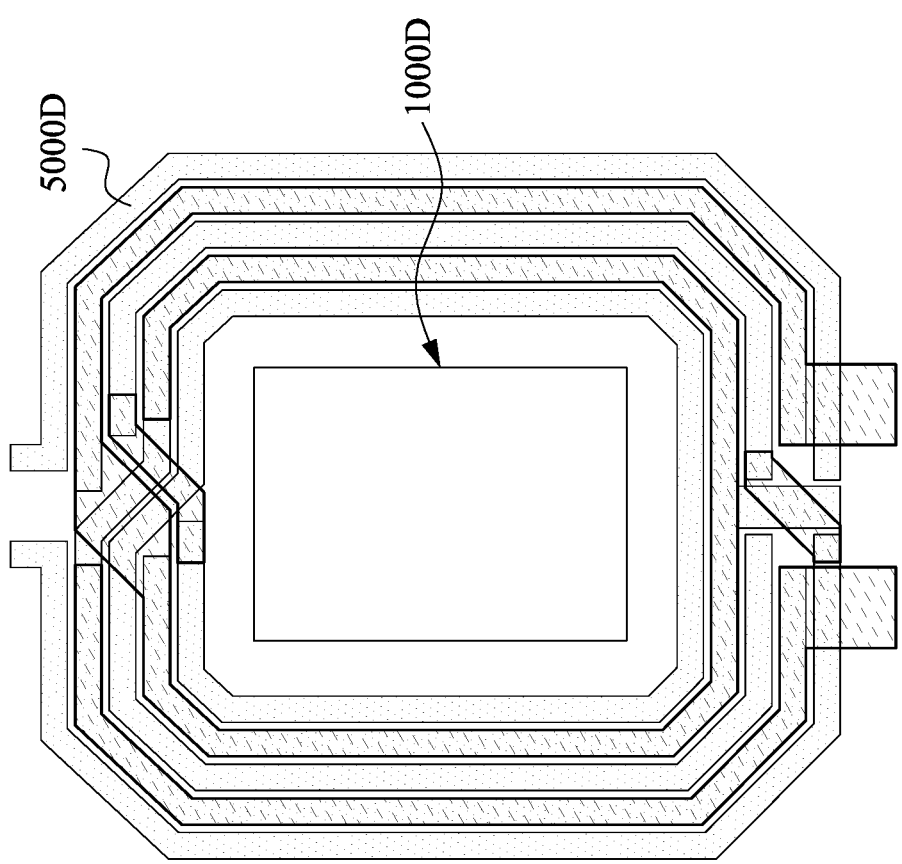
FIG. 6 depicts a schematic diagram of an inductor device according to one embodiment of the present disclosure.

FIG. 6 depicts a schematic diagram of an inductor device according to one embodiment of the present disclosure. Compared with disposing the inductor 5000C inside the inductor device 1000C shown in FIG. 5, the inductor device 1000D shown in FIG. 6 is disposed inside the inductor 5000D. It is noted that, the element in FIG. 6, whose symbol is similar to the symbol of the element in FIG. 5, has similar structure feature in connection with the element in FIG. 5. Therefore, a detail description regarding the structure feature of the element in FIG. 6 is omitted herein for the sake of brevity. Furthermore, the present disclosure is not limited to the structure as shown in FIG. 6, and the type of the inductor device inside the inductor 5000D can be other suitable type, for example, the inductor device inside the inductor 5000D can be one of the inductor devices 1000~1000B shown in FIG. 1 to FIG. 4, depending on accrual requirements. Besides, the present disclosure is not limited to the structure as shown in FIG. 6, and it is merely an example for illustrating one of the implements of the present disclosure.

Figure 7:
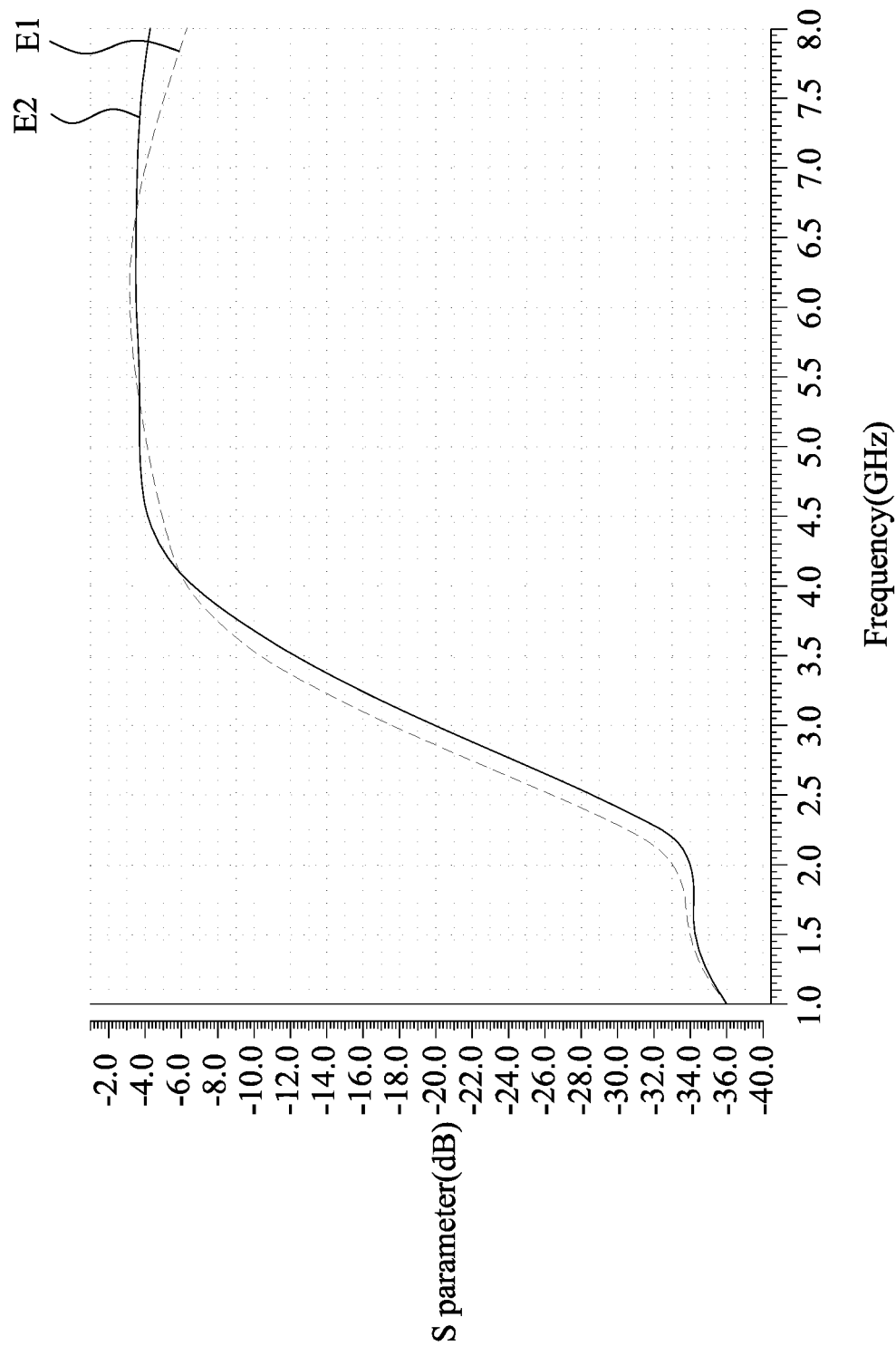
FIG. 7 depicts a schematic diagram of experimental data of an inductor device according to one embodiment of the present disclosure.

FIG. 7 depicts a schematic diagram of experimental data of an inductor device according to one embodiment of the present disclosure. As shown in the figure, the experimental curves of S parameter of the inductor device of the present disclosure are E1, E2. The curve E1 is an experimental curve of the inductor device that adopts capacitors with the same capacitance, for example, capacitances of the capacitors in the inductor device are all 330 fF. The curve E2 is an experimental curve of the inductor device that adopts capacitors with different capacitances, for example, one of capacitances of the capacitors in the inductor device is 330 fF, and another one of capacitances of the capacitors in the inductor device is 150 fF. As can be seen in the figure, the curve E1 or the curve E2 shows that the inductor device, which adopts capacitors with the same capacitance or with different capacitances, may filter signals around 2.4 GHz and let signals around 5 GHz pass. Furthermore, as shown in the figure, the curve E1 or the curve E2 shows that the inductor device may filter signals larger than 8 GHz, for example, the inductor device may filter signals around 10 GHz, because the curve E1 or the curve E2 are moving down around 8 GHz.

It can be understood from the embodiments of the present disclosure that application of the present disclosure has the following advantages. The inductor device of the present disclosure may induce high frequency signal (e.g., second harmonic) of inductor (e.g., 5000C) inside the inductor device. After the high frequency signal is amplified by additional circuit, the amplified high frequency signal is able to cancel negative effect to the circuit caused by second harmonic. For example, the capacitor of the inductor device is used to let high frequency signal pass and block low frequency signal. Therefore, the inductor device is able to deal with signals in high frequency or low frequency by two kinds of inducing manner.

In addition, since the filter is disposed inside integrated circuit (IC), for example, the inductor device, of the present disclosure, there is no need to dispose a filter outside of the inductor device, so as to prevent an outer filter from affecting the circuit or prevent additional costs. In addition, the capacitor of the inductor device of the present disclosure is used to block high frequency signal (e.g., second harmonic), and the disposition of multiple capacitors of the inductor device of the present disclosure is used to further induce and filter signals (e.g., fourth harmonic) with a frequency, which is larger than a frequency of the high frequency signal, by a short circuit manner, so as to prevent negative effect to the circuit caused by fourth harmonic.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor device, comprising:
   a first trace, comprising at least two sub-traces, wherein one terminal of each of the at least two sub-traces are coupled to each other at a first node;
   a second trace, comprising at least two sub-traces, wherein one terminal of each of the at least two sub-traces are coupled to each other at a second node;
   a third trace, wherein the first trace and the third trace are disposed at a first side, wherein one terminal of the third trace is coupled to one of the at least two sub-traces of the second trace, and another terminal of the third trace is coupled to a first input/output terminal;
   a fourth trace, wherein the second trace and the fourth trace are disposed at a second side, wherein one terminal of the fourth trace is coupled to one of the at least two sub-traces of the first trace, and another terminal of the fourth trace is coupled to a second input/output terminal;
   a first capacitor, coupled between the first node and the second node; and
   a second capacitor, coupled between the first node and the first input/output terminal, or coupled between the first node and the second input/output terminal, or coupled between the first input/output terminal and the second input/output terminal;
   wherein each of the third trace and the fourth trace comprises at least two sub-traces, wherein each of the at least two sub-traces of each of the first trace, the second trace, the third trace and the fourth trace is U-typed trace.

2. The inductor device of claim 1, further comprising:
   a third capacitor, coupled between the second node and the first input/output terminal, or coupled between the second node and the second input/output terminal.

3. The inductor device of claim 2, wherein the second capacitor is coupled between the first node and the first input/output terminal, and the third capacitor is coupled between the second node and the second input/output terminal.

4. The inductor device of claim 3, wherein the at least two sub-traces of the first trace comprise:
   a first sub-trace, comprising:
     a first terminal; and
     a second terminal; and
   a second sub-trace, comprising:
     a first terminal; and
     a second terminal, coupled with the second terminal of the first sub-trace at the first node.

5. The inductor device of claim 4, wherein the at least two sub-traces of the second trace comprise:
   a third sub-trace, comprising:
     a first terminal; and
     a second terminal; and
   a fourth sub-trace, comprising:
     a first terminal; and
     a second terminal, coupled with the second terminal of the third sub-trace at the second node.

6. The inductor device of claim 5, wherein the third trace comprises:
   a fifth sub-trace, comprising:
     a first terminal, coupled to the first terminal of the fourth sub-trace; and
     a second terminal; and
   a sixth sub-trace, comprising:
     a first terminal, coupled to the first terminal of the third sub-trace; and
     a second terminal, coupled to the first input/output terminal, and coupled to the first node through the second capacitor.

7. The inductor device of claim 6, wherein the at least two sub-traces of the fourth trace comprise:
   a seventh sub-trace, comprising:
     a first terminal, coupled to the first terminal of the second sub-trace; and
     a second terminal, coupled to the second input/output terminal, and coupled to the second node through the third capacitor; and
   an eighth sub-trace, comprising:
     a first terminal, coupled to the first terminal of the first sub-trace; and
     a second terminal, coupled to the second terminal of the fifth sub-trace.

8. The inductor device of claim 2, wherein the second capacitor is coupled between the first node and the second input/output terminal, and the third capacitor is coupled between the second node and the first input/output terminal.

9. The inductor device of claim 8, wherein the at least two sub-traces of the first trace comprise:
   a first sub-trace, comprising:
     a first terminal; and
     a second terminal; and
   a second sub-trace, comprising:
     a first terminal; and
     a second terminal, coupled with the second terminal of the first sub-trace at the first node.

10. The inductor device of claim 9, wherein the at least two sub-traces of the second trace comprise:
    a third sub-trace, comprising:
      a first terminal; and
      a second terminal; and
    a fourth sub-trace, comprising:
      a first terminal; and a second terminal, coupled with the second terminal of the third sub-trace at the second node.

11. The inductor device of claim 10, wherein the third trace comprises:
a fifth sub-trace, comprising:
a first terminal, coupled to the first terminal of the fourth sub-trace; and
a second terminal; and
a sixth sub-trace, comprising:
a first terminal, coupled to the first terminal of the third sub-trace; and
a second terminal, coupled to the first input/output terminal, and coupled to the second node through the third capacitor.

12. The inductor device of claim 11, wherein the at least two sub-traces of the fourth trace comprise:
a seventh sub-trace, comprising:
a first terminal, coupled to the first terminal of the second sub-trace; and
a second terminal, coupled to the second input/output terminal, and coupled to the first node through the second capacitor; and
an eighth sub-trace, comprising:
a first terminal, coupled to the first terminal of the first sub-trace; and
a second terminal, coupled to the second terminal of the fifth sub-trace.

13. The inductor device of claim 1, wherein the third trace is disposed at and outer side of the first trace.

14. The inductor device of claim 13, wherein the fourth trace disposed at an outer side of the second trace.

15. The inductor device of claim 1, wherein the first side and the second side are located at two opposite sides of the inductor device.

16. The inductor device of claim 1, wherein the first trace is coupled to the fourth trace at a third side through a first connection component, wherein the second trace is coupled to the third trace at the third side through a second connection component, wherein the first connection component and the second connection component are disposed in an interlaced manner at the third side.

17. The inductor device of claim 16, wherein the first capacitor and the second capacitor are located at a fourth side.

18. The inductor device of claim 17, wherein the third side and the fourth side are located at two opposite sides of the inductor device.

19. An inductor device, comprising:
a first trace, comprising at least two sub-traces, wherein one terminal of each of the at least two sub-traces are coupled to each other at a first node;
a second trace, comprising at least two sub-traces, wherein one terminal of each of the at least two sub-traces are coupled to each other at a second node;
a third trace, wherein the first trace and the third trace are disposed at a first side and are not disposed at a second side opposite to the first side, wherein one terminal of the third trace is coupled to one of the at least two sub-traces of the second trace, and another terminal of the third trace is coupled to a first input/output terminal;
a fourth trace, wherein the second trace and the fourth trace are disposed at the second side and are not disposed at the first side, wherein one terminal of the fourth trace is coupled to one of the at least two sub-traces of the first trace, and another terminal of the fourth trace is coupled to a second input/output terminal;
a first capacitor, coupled between the first node and the second node; and
a second capacitor, coupled between the first node and the first input/output terminal, or coupled between the first node and the second input/output terminal, or coupled between the first input/output terminal and the second input/output terminal.

\* \* \* \* \*